United States Patent
Nakanishi

(10) Patent No.: US 8,521,458 B2
(45) Date of Patent: Aug. 27, 2013

(54) APPARATUS AND METHOD FOR DETECTING CHARGED STATE OF ELECTRIC STORAGE DEVICE

(75) Inventor: Toshiaki Nakanishi, Toyohashi (JP)

(73) Assignee: Panasonic EV Energy Co., Ltd., Kosai-shi (JP)

(*) Notice: Subject to any disclaimer, the term of this patent is extended or adjusted under 35 U.S.C. 154(b) by 558 days.

(21) Appl. No.: 12/529,709

(22) PCT Filed: Feb. 13, 2008

(86) PCT No.: PCT/JP2008/052333
§ 371 (c)(1),
(2), (4) Date: Sep. 2, 2009

(87) PCT Pub. No.: WO2008/132857
PCT Pub. Date: Nov. 6, 2008

(65) Prior Publication Data
US 2010/0023285 A1    Jan. 28, 2010

(30) Foreign Application Priority Data
Apr. 19, 2007 (JP) ................. 2007-110013

(51) Int. Cl.
*G01R 31/36* (2006.01)
*G01R 19/00* (2006.01)
*H02J 7/00* (2006.01)

(52) U.S. Cl.
USPC ........... 702/64; 702/57; 702/63; 702/183; 702/189; 320/132; 320/152; 324/433

(58) Field of Classification Search
USPC ........... 702/57, 63, 64, 183, 189; 320/132, 320/152; 324/433
See application file for complete search history.

(56) References Cited

U.S. PATENT DOCUMENTS

| 5,193,067 | A  | 3/1993  | Sato     |
|-----------|----|---------|----------|
| 5,539,318 | A  | 7/1996  | Sasaki   |
| 6,150,823 | A  | 11/2000 | Takahashi |
| 6,232,747 | B1 | 5/2001  | Takahashi |
| 6,285,163 | B1 | 9/2001  | Watanabe |

FOREIGN PATENT DOCUMENTS

| DE | 19 903 239 A1 | 8/2000 |
|----|---------------|--------|
| EP | 1 003 234 A1  | 5/2000 |
| JP | 56-126773 A   | 10/1981 |
| JP | 3-63582 A     | 3/1991 |
| JP | 3-183329 A    | 8/1991 |
| JP | 5-45429 A     | 2/1993 |
| JP | 6-59003 A     | 3/1994 |
| JP | 2002-189066 A | 7/2002 |
| WO | 99/61929 A1   | 12/1999 |

OTHER PUBLICATIONS

JP 2002189066 Machine Translation.* International Search Report dated May 20, 2008, issued in corresponding International Application No. PCT/JP2008/052333, filed Feb. 13, 2008.
Extended European Search Report mailed Jul. 5, 2011 issued in corresponding European Application No. EP 08 71 119, filed Feb. 13, 2008, 8 pages.
Notification of First Office Action mailed Nov. 14, 2011, issued in corresponding Chinese Application No. 200880007940.6, 15 pages.

* cited by examiner

*Primary Examiner* — Alexander H Taningco
*Assistant Examiner* — L. Anderson
(74) *Attorney, Agent, or Firm* — Christensen O'Connor Johnson Kindness PLLC

(57) ABSTRACT

Provided is an apparatus for detecting state of charge (SOC) of a battery. A voltage of a battery pack (100) is detected by voltage sensors (120-1) to (**120-*n*). A determining unit (160**) samples currents at times when the battery voltage reaches predetermined threshold voltages (Vth1, Vth2) respectively, and calculates an open end voltage (Vocv), based on representative values (I1, I2) of the sampled currents and threshold voltages (Vth1, Vth2). Furthermore, based on a correspondence relationship between the voltage (Vocv) and the state of charge (SOC) which is determined in advance, the state of charge (SOC) that corresponds to the calculated voltage (Vocv) is calculated.

8 Claims, 9 Drawing Sheets

APPARATUS AND METHOD FOR DETECTING CHARGED STATE OF ELECTRIC STORAGE DEVICE

TECHNICAL FIELD

The present invention relates to a device, a method, and a program for detecting a state of charge of an electric storage device, and in particular, to a device for detecting the state of charge (SOC) of the electric storage device based on an open end voltage (Vocv).

BACKGROUND ART

In the related art, a battery pack in which a block is constructed by connecting one or a plurality of batteries in series and a plurality of the blocks are connected in series is equipped in a hybrid automobile and an electric automobile, and various methods are proposed which detect or estimate the state of charge (SOC) of the battery.

For example, WO99/61929 discloses a technique having a battery model in which a simulated SOC is determined as a tentative value of the SOC of the battery and a battery voltage is estimated in consideration of a change of the state of the battery along with the simulated SOC, wherein the simulated SOC is corrected so that the estimated battery voltage and the battery voltage which is actually measured are equal to each other, to estimate the actual SOC.

FIG. 13 shows a structure of a device disclosed in WO99/61929. A charge/discharge current value detected by a current detecting unit 10 is integrated by a simulated SOC estimating unit 14 and is added to an initial value of the SOC of the battery which is determined in advance, so that the simulated SOC which is a tentative value of the SOC is estimated. Based on the estimated simulated SOC, an electromotive force estimating unit 16 estimates a battery voltage corresponding to the simulated SOC. The battery voltage is an open end voltage Vocv of the battery. The open end voltage Vocv is estimated by determining in advance, for each battery, a map between the SOC and the open end voltage. Based on the charge/discharge current, a voltage change estimating unit 18 estimates a voltage change due to an internal resistance of the battery. In addition, a dynamic voltage change estimating unit 20 estimates a change of the battery voltage based on a change of the charge/discharge current of the battery. The output values of the electromotive force estimating unit 16, the voltage change estimating unit 18, and the dynamic voltage change estimating unit 20 are added by an adder 22, and an estimated value Vest of the battery voltage is calculated. The estimated battery voltage Vest is compared by a comparator 24 with the actual measured voltage Vmes of a battery detected by the voltage detecting unit 12, and the difference is supplied to an SOC correction amount calculating unit 26. The SOC correction amount calculating unit calculates an amount of correction which makes the estimated voltage Vest equal to the measured voltage Vmes, and outputs the amount of correction to an adder 28, to correct the simulated SOC.

The open end voltage Vocv is calculated by determining, for each battery, the map between the SOC and the open end voltage in advance. If the open end voltage can be detected with a high precision, the SOC can be estimated using the map. In the related art, a method is known in which the open end voltage Vocv is calculated by measuring the voltage and current of the battery and using the method of least squares. However, such a method causes an increase in amount of calculation, and consequently, increases the processing time and load of the process program. In addition, if the operation speed is increased in this state, heat generation occurs, which is disadvantageous in terms of reducing the size of the detecting device.

DISCLOSURE OF INVENTION

The present invention provides a device which can quickly and accurately detect a state of charge (SOC) of an electric storage device, with a simple structure.

According to one aspect of the present invention, there is provided a device which detects a state of charge of an electric storage device, comprising a measuring unit which measures a first current value at a time when a voltage of the electric storage device becomes equal to a first predetermined voltage and a second current value at a time when the voltage of the electric storage device becomes equal to a second predetermined voltage, and a detecting unit which detects the state of charge of the electric storage device based on the measured first current value and the measured second current value.

According to another aspect of the present invention, there is provided a method of detecting a state of charge of an electric storage device, comprising the steps of measuring a first current value at a time when a voltage of the electric storage device becomes equal to a first predetermined voltage and a second current value at a time when the voltage of the electric storage device becomes equal to a second predetermined voltage, and detecting the state of charge of the electric storage device based on the measured first current value and the measured second current value.

According to another aspect of the present invention, there is provided a recording medium which stores a computer program for detecting a state of charge of an electric storage device, which, when executed, causes a computer to execute a process comprising measuring a first current value at a time when a voltage of the electric storage device becomes equal to a first predetermined voltage, measuring a second current value at a time when the voltage of the electric storage device becomes equal to a second predetermined voltage, sequentially storing the measured first current value and the measured second current value in a memory, instructing a calculating unit to calculate a first representative current value through a predetermined statistical process based on a plurality of the first current values stored in the memory and to calculate a second representative current value through a predetermined statistical process based on a plurality of the second current values, instructing the calculating unit to calculate an open end voltage based on the first representative current value and the second representative current value obtained through the calculation, and accessing a storage device which stores, in advance, a correspondence relationship between an open end voltage and a state of charge, to search for a state of charge corresponding to the open end voltage obtained through the calculation.

According to another aspect of the present invention, there is provided a device which detects a state of charge of an electric storage device, comprising a measuring unit which measures a current value at a time when a voltage of the electric storage device becomes equal to a predetermined voltage, and a detecting unit which detects a state of charge of the electric storage device based on the measured current value.

According to various aspects of the present invention, the state of charge (SOC) of the electric storage device can be detected with a simple structure.

BRIEF DESCRIPTION OF DRAWINGS

FIG. 15 is a graph showing a correspondence relationship between SOC and In.

BEST MODE FOR CARRYING OUT THE INVENTION

Preferred embodiments of the present invention will now be described exemplifying a battery pack as an electric storage device.

Figure 1:
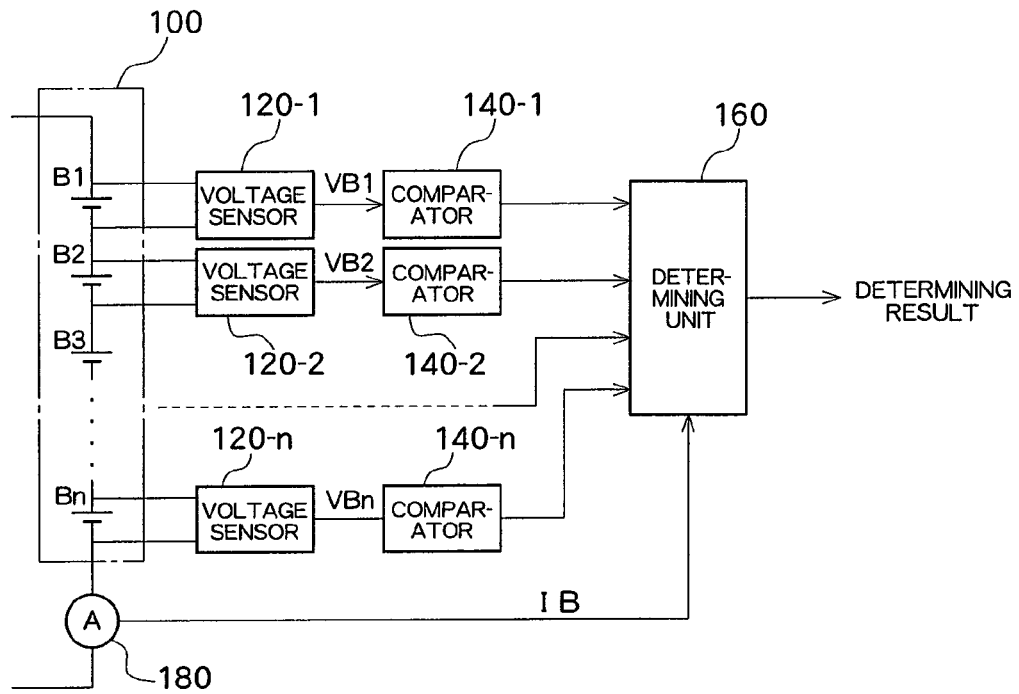
FIG. 1 is an overall structural diagram of a state-of-charge detecting device according to a preferred embodiment of the present invention.

FIG. 1 shows a structure of a state-of-charge detecting device in a preferred embodiment of the present embodiment. The state-of-charge detecting device is equipped in, for example, a hybrid automobile, and detects a state of charge of a battery pack.

In FIG. 1, a battery pack 100 which is an electric storage device comprises a plurality of blocks B1~Bn, and the blocks B1~Bn are connected in series. Each block comprises one or a plurality of single batteries connected in series. Each battery is, for example, a nickel metal hydride battery or lithium-ion battery.

Voltage sensors 120-1~120-n detect block voltages VB1~VBn of the blocks B1~Bn of the battery cell 100, respectively. The detected block voltages VB1~VBn are supplied to comparators 140-1~140-n, respectively.

The comparators 140-1~140-n compare the input block voltages VB1~VBn with a first predetermined voltage and a second predetermined voltage, and determine whether or not the block voltages VB1~VBn have reached the first predetermined voltage and the second predetermined voltage. When the block voltages VB1~VBn match the first predetermined voltage and the second predetermined voltage, the comparators 140-1~140-0n supply match signals to a determining unit 160. The predetermined voltage for determination in each comparator 140-1~140-n has the same value. Therefore, when the block voltages VB1~VBn are approximately equal, the match signals are output at approximately the same time from the comparators 140-1~140-n. The match signals which are output from the comparators 140-1~140n function as sampling signals for defining timing for sampling of the current of the battery pack.

A current sensor 180 detects a current IB of the battery pack 100. The detected current IB is supplied to the determining unit 160.

The determining unit 160 samples the current IB supplied from the current sensor 180 at the time the match signals are supplied from the comparators 140-1~140-n, and stores the current values in a memory. Therefore, the memory stores current values at times when the block voltage VB1 of the block B1 has reached the first predetermined voltage, current values at times when the block voltage VB1 of the block B1 has reached the second predetermined voltage, current values at times when the block voltage VB2 of the block B2 has reached the first predetermined voltage, current values at times when the block voltage VB2 of the block B2 has reached the second predetermined voltage, current values at times when the block voltage VBn of the block Bn has reached the first predetermined voltage, and current values at times when the block voltage VBn of the block Bn has reached the second predetermined voltage. The determining unit 160 applies a statistical process on the sampling currents stored in the memory for each block, and calculates a representative current value at the timing when the first predetermined voltage is reached and a representative current value at a timing when the second predetermined voltage is reached. The statistical process is, for example, an average value calculating process. The determining unit 160 also calculates, for each block, an open end voltage Vocv based on the representative current values calculated as described above, and calculates the SOC based on Vocv.

Note that while in the related art, pair data of the block voltage and the block current is detected and the open end voltage Vocv is calculated through the method of least squares or through regression analysis, in the present embodiment, the Vocv is calculated based on the current values at the times when the block voltage reaches the predetermined voltages.

The determining unit 160 may be formed with a microcomputer, and may be formed in an IC including the comparators 140-1~140-n.

Figure 2:
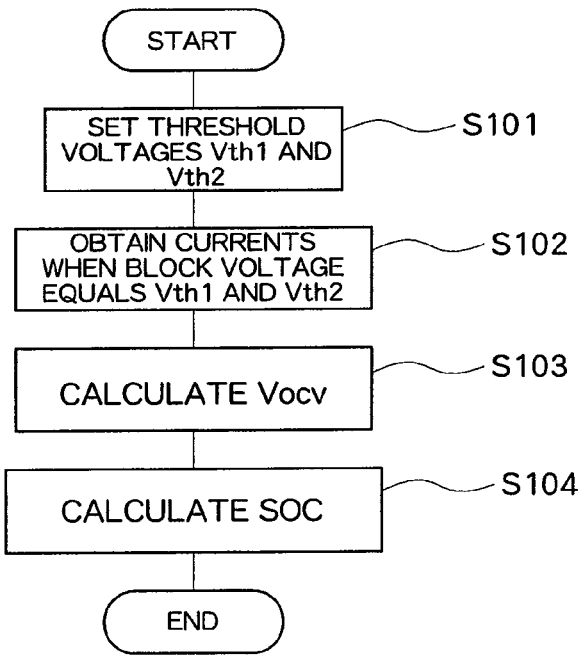
FIG. 2 is a process flowchart of a preferred embodiment of the present invention.

FIG. 2 is a flowchart of the SOC calculation process of the present embodiment. First, two threshold voltages Vth1 and Vth2 (wherein Vth1<Vth2) which are the predetermined voltages to be compared with the block voltages VB1~VBn in the comparators 140-1~140-n are set (S101). The method of setting the threshold voltages Vth1 and Vth2 is arbitrary, but it is desirable that the threshold voltages Vth1 and Vth2 be set to predetermined values within a voltage change range when the battery pack 100 repeats charging and discharging as the vehicle runs, in order to allow a large number of current samplings in a short period of time. The threshold voltages Vth1 and Vth2 may be set, for example, to Vth1=7.5 V and Vth2=8.5V. The threshold voltages Vth1 and Vth2 may be supplied to the comparators 140-1~140-n in advance or a configuration may be employed in which the threshold voltages Vth1 and Vth2 are registered in a register and then supplied to the comparators 140-1~140-n so that the threshold voltages Vth1 and Vth2 can be suitably adjusted by replacing the content of the register.

After two threshold voltages Vth1 and Vth2 are set (S101), the comparators 140-1~140-n compare the block voltages VB1~VBn to the threshold voltages Vth1 and Vth2, and current values when the block voltages VB1~VBn have reached the threshold voltages Vth1 and Vth2 are obtained (S102). The obtained current values are sequentially stored in the memory for each block. Then, for each block, a representative value of the current is calculated for a time when the threshold voltage Vth1 is reached and a representative value of the current is calculated for a time when the threshold voltage Vth2 is reached, and based on the representative current values and the threshold voltages Vth1 and Vth2, the open end voltage Vocv (electromotive force) is calculated (S103). More specifically, because the block voltage VB and the block current IB have a relationship of:

$$VB = IB \cdot R + Vocv$$

wherein R is the internal resistance of the battery, if the current value is I1 at the time when the block voltage VB reaches the threshold voltage Vth1 and the current value is I2 at the time when the block voltage reaches the threshold voltage Vth2, $$Vth1 = I1 \cdot R + Vocv$$

$$Vth2 = I2 \cdot R + Vocv$$

Therefore, it is possible to calculate Vocv by $$Vocv = (I2 \cdot Vth2 - I1 \cdot Vth1)/(I2 - I1) \qquad (1)$$

After Vocv is calculated, the SOC corresponding to the calculated Vocv is calculated using a map defining the relationship between Vocv and SOC which is determined in advance (S104). The values of SOC of the blocks are calculated by similar processes.

The process of FIG. 2 can be realized by the microcomputer which is apart of the determining unit 160 or a part of the determining unit 160 and the comparators 140-1~140-n sequentially executing an SOC calculating program stored in a ROM. The SOC calculating program may be stored on a recording medium such as a CD-ROM and installed in a computer. Any type of recording medium for storage of the SOC calculating program may be used, and the recording medium may be an arbitrary medium such as a CD-ROM, a DVD-ROM, a flash memory, etc. The current value of each block obtained in S102 is sequentially stored in a work memory of the microcomputer. In S103, the processor of the microcomputer reads the plurality of current values for each block stored in the memory, applies a predetermined statistical process, for example, an average value calculation process, and calculates the representative current value. The calculated representative current value is again stored in the work memory. Then, using the equation (1), the open end voltage Vocv is calculated. In S104, the processor of the microcomputer reads Vocv stored in the work memory and searches for an SOC corresponding to Vocv referring to a map which is stored in the memory in advance.

Figure 3:
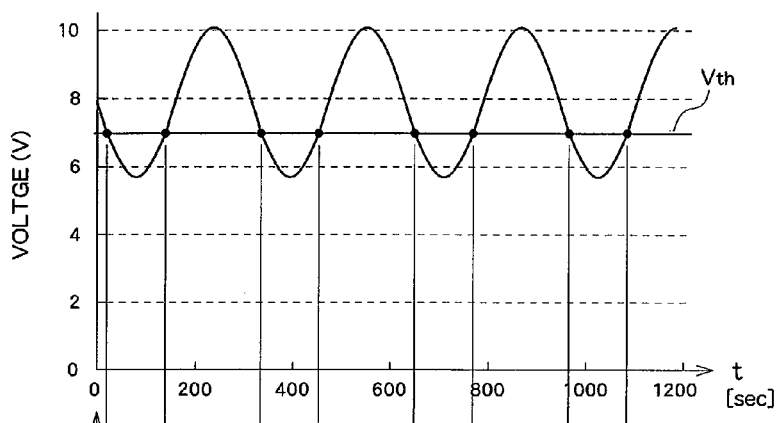
FIGS. 3(a), 3(b), and 3(c) are a timing chart showing a current sampling timing.

FIG. 3 shows a current sampling timing for an arbitrary block Bi which is a part of the battery pack 100. FIG. 3(a) shows a change with respect to time of the block voltage detected by a voltage sensor 120-i. The horizontal axis represents time (s) and the vertical axis represents a voltage value (V). With repetition of charging and discharging, the block voltage also changes between approximately 6 V and approximately 10 V. FIG. 3 also shows the set threshold voltage Vth. As the threshold voltage, two threshold voltage Vth1 and Vth2 are set as already described, but for convenience of explanation, only one threshold voltage Vth is shown. In FIG. 3, the threshold voltage Vth is set to approximately 7 V. In FIG. 3, the block voltage and the threshold voltage Vth match at the times shown with black circles.

FIG. 3(b) shows a signal waveform of a result of comparison of the block voltage and the threshold voltage Vth at the comparator 140-i. If a configuration is employed in which the comparators 140-1~140-n compare the block voltages and the threshold voltage and output a voltage signal of a Hi level when block voltage≧threshold voltage Vth and output a voltage signal of a Low level when block voltage<threshold voltage, a square wave signal as shown in FIG. 3(b) is output. The timing of the rise and fall of the square wave signal represent times when the block voltage and the threshold voltage Vth are equal. Therefore, the determining unit 160 samples, when the square wave signal as shown in FIG. 3(b) is input, the current IB at times synchronized with the times of the rise and fall of the square wave signal, so that the current at the time when the block voltage has reached the threshold voltage Vth can be obtained.

FIG. 3(c) shows a change with respect to time of the current detected by the current sensor 180. With the repetition of the charging and discharging, the current also changes towards the positive side and the negative side (when the positive side is set as charging, the negative side indicates discharging). The determining unit 160 samples the current IB at the timing of the rise and fall of the square wave signal from the comparator 140-i and obtains I1~I8. The obtained current values are sequentially stored in the memory, and a representative value of the current values I1~I8 is calculated.

Figure 4:
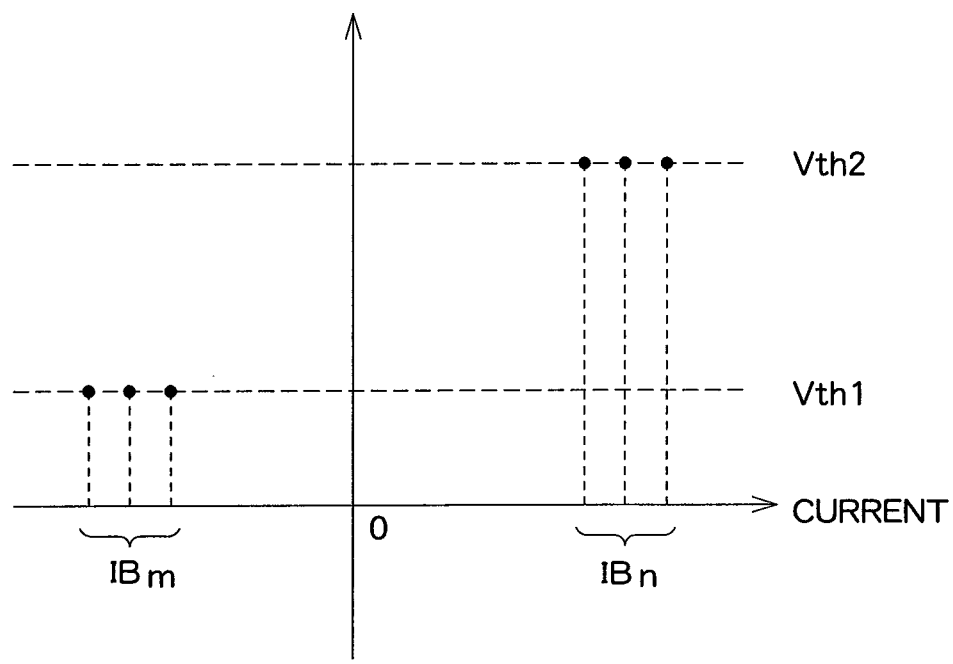
FIG. 4 is an explanatory diagram showing sampled currents.

FIG. 4 shows a current-voltage characteristic, with the block current plotted on the horizontal axis and the block voltage plotted on the vertical axis. Current values at the times when the block voltage has reached the threshold voltages Vth1 and Vth2 are shown with IBm and IBn.

Figure 5:
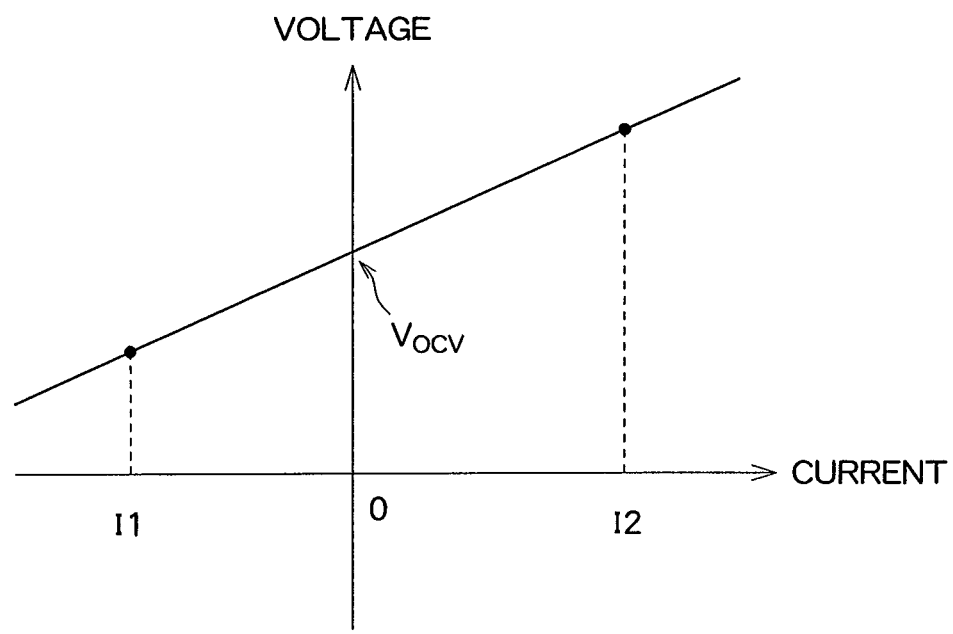
FIG. 5 is a graph showing Vocv.

FIG. 5 shows a plot with a representative current I1 of the currents IBm in FIG. 4 and a representative current I2 of the currents IBn in FIG. 4. A straight line connecting (I1, Vth1) and (I2, Vth2) represents VB=IB·R+Vocv, and an intercept of the straight line corresponds to Vocv.

Figure 6:
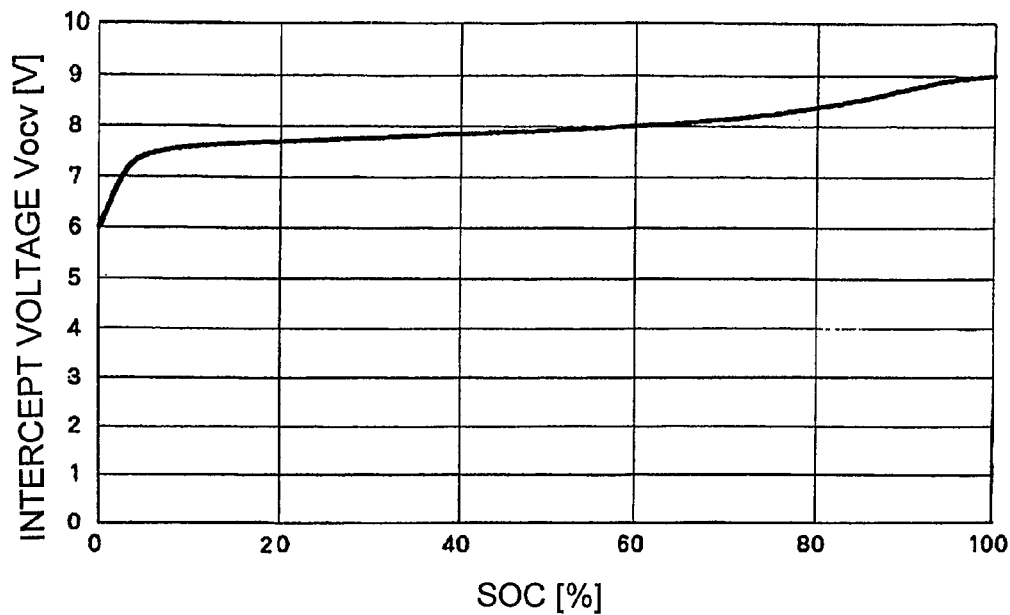
FIG. 6 is a graph showing a correspondence relationship between Vocv and SOC.

FIG. 6 shows an example of a map which defines a relationship between SOC and Vocv. The relationship between SOC and Vocv has a temperature dependence, and FIG. 6 shows a map corresponding to a battery temperature of 25° C. The map is prepared for each temperature and the SOC corresponding to Vocv can be calculated.

Figure 7:
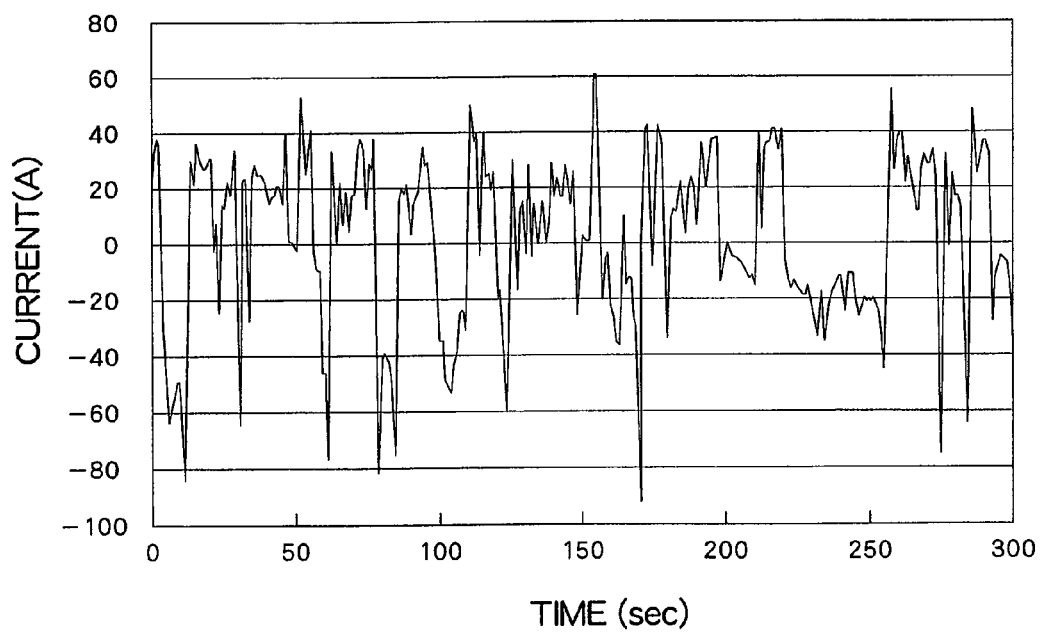
FIG. 7 is a graph showing a current profile.
Figure 8:
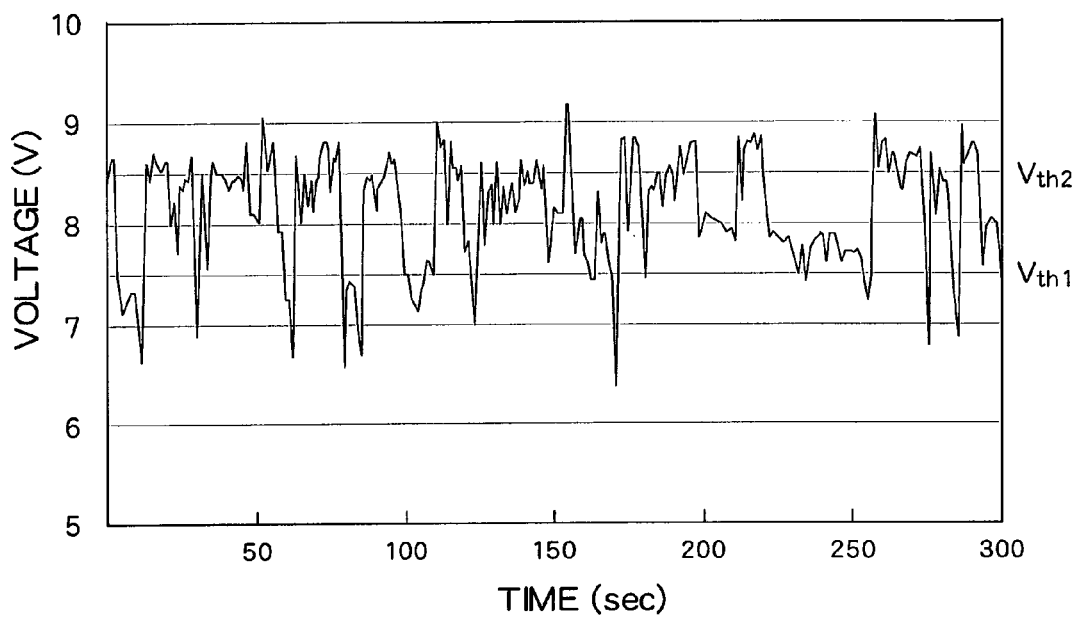
FIG. 8 is a graph showing a voltage profile.
Figure 9:
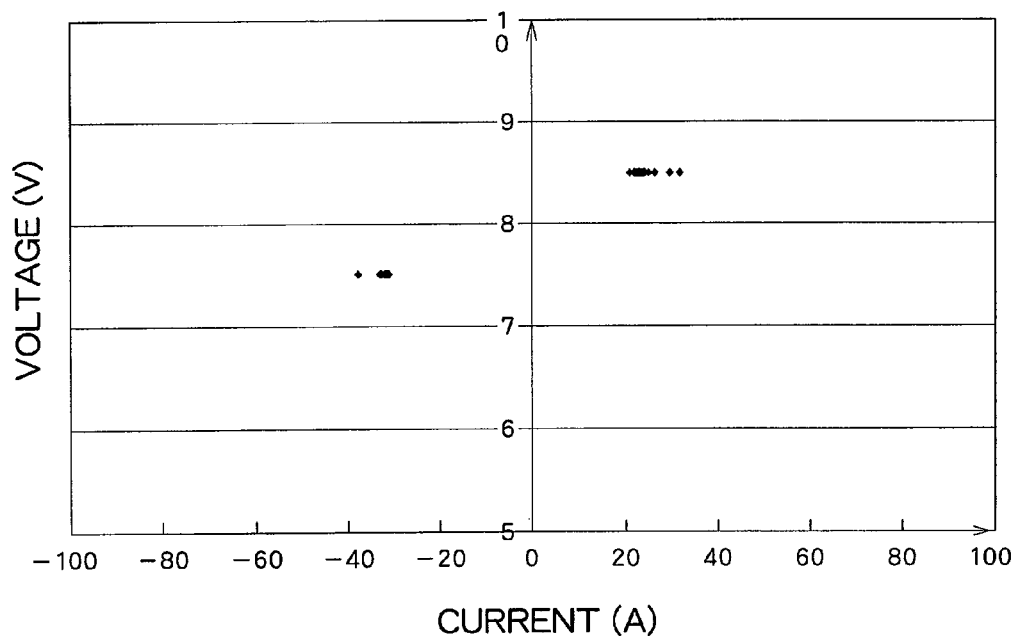
FIG. 9 is an explanatory diagram showing currents at the time of reaching a threshold voltage.

In the following, the SOC calculation result using a method of related art and the SOC calculation result using the present embodiment will be described in comparison to each other. FIGS. 7 and 8 show a current profile and a voltage profile of a battery used for the SOC calculation. In FIG. 8, the threshold voltage Vth1 (7.5 V) and the threshold voltage Vth2 (8.5 V) are also shown along with the voltage profile. FIG. 9 shows a plot of sampling a current at the times when the voltage reaches the threshold voltages Vth1 and Vth2 in consideration of such a current profile and a voltage profile. In the present embodiment, a representative value I1 of current values at the time when the voltage reaches Vth1 is calculated, a representative value I2 of current values at the time when the voltage reaches Vth2 is calculated, and Vocv is calculated based on equation (1). Vocv is calculated as Vocv=8.0825 (V).

Figure 10:
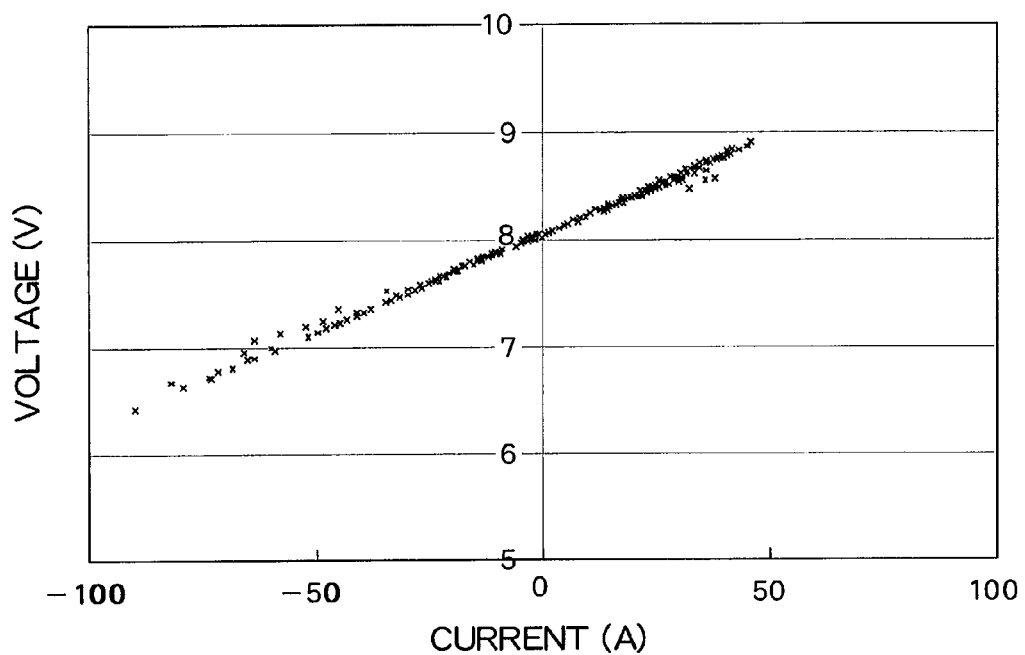
FIG. 10 is a plot explanatory diagram of a measured current and a measured voltage by a method of the related art.

FIG. 10 shows a result of plot by a method of the related art. FIG. 10 shows a plot of pairs of (current, voltage), and Vocv is calculated by the method of least squares based on these pairs. Vocv is calculated as Vocv=8.087 V. A difference in Vocv between the two methods is 0.0045 V which is a difference of only approximately 0.3% in terms of SOC.

Figure 11:
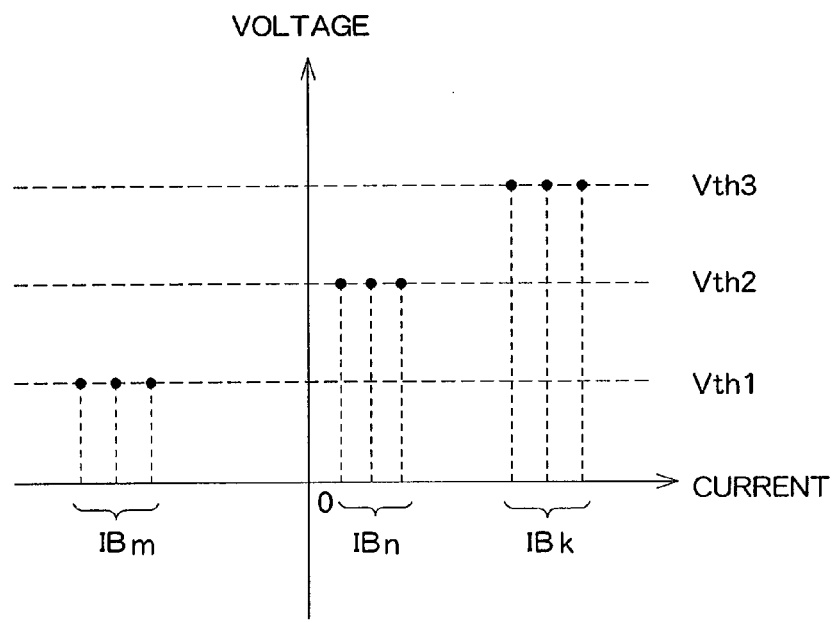
FIG. 11 is an explanatory diagram showing sampled currents in another preferred embodiment of the present invention.

A preferred embodiment of the present invention has been described. The present invention, however, is not limited to the above-described preferred embodiment, and various modifications may be made. For example, in the present embodiment, two threshold values of Vth1 and Vth2 are used as the threshold voltage, but alternatively, it is also possible to use three or more threshold voltages. FIG. 11 shows an example configuration where three threshold voltages Vth1, Vth2, and Vth3 are used. Current values IBm, IBn, and IBk corresponding to the timings when the threshold voltages are reached are detected, representative values of the current values are calculated, and Vocv is calculated based on the three representative values.

Figure 12:
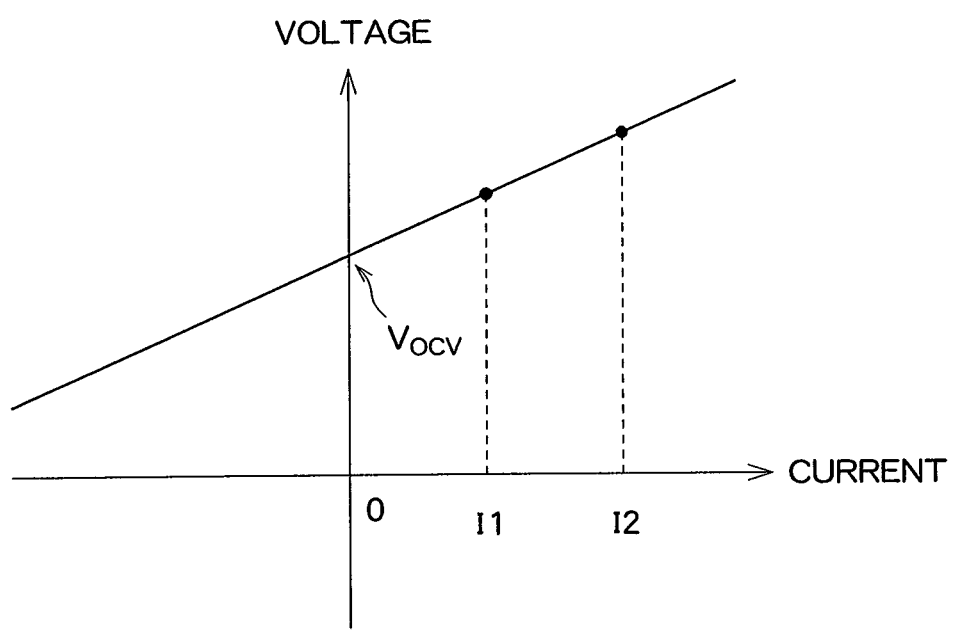
FIG. 12 is a graph showing Vocv of yet another preferred embodiment of the present invention.
Figure 13:
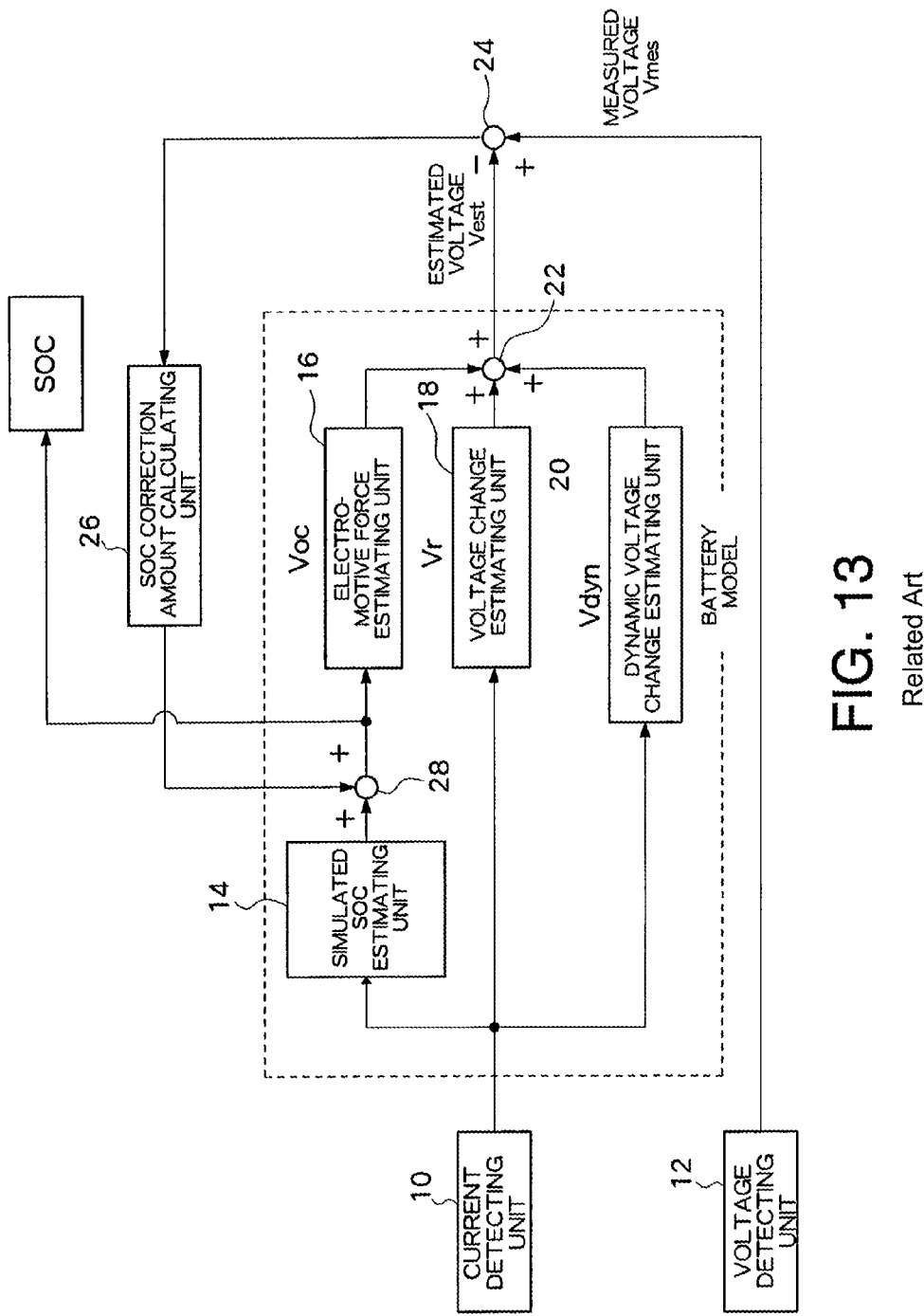
FIG. 13 is a structural diagram of a device of the related art.

In addition, in the present embodiment, the current values IBm at the discharge side and the current values IBn at the charging side are detected by adjusting the threshold voltages Vth1 and Vth2 (refer to FIG. 4), but the present invention is not limited to such a configuration, and the representative values I1 and I2 may be calculated based on only the current values on the side of charge as shown in FIG. 12. Alternatively, it is also possible to calculate the representative values I1 and I2 based on only the current values on the side of the discharge.

In the present embodiment, a current value is obtained at a time when the block voltage becomes equal to the threshold voltage Vth, but the current value at the time of reaching the threshold voltage Vth does not require a strict simultaneity, and may be obtained within a certain allowable time range. Simultaneity within 100 msec would be sufficient for the simultaneity required for calculating the SOC. The allowable range of simultaneity would be determined according to the precision required for the SOC calculation. When the electric storage battery is equipped in a hybrid vehicle, the drive carrier frequency of the hybrid motor is in the order of KHz, and, according to Nyquist's theorem, theoretically, simultaneity of 1 msec or less is desired. Based on the experiences of the present inventors, however, such a degree of simultaneity is not required, and simultaneity of approximately 100 msec as described above is sufficient.

In addition, in the present embodiment, the representative value of current values at the time when the threshold voltage Vth is reached is calculated, but it is also possible to calculate the representative value while removing a current value sample having a low precision when the representative value is calculated, to improve the precision of the simultaneity. More specifically, it is determined whether or not the current value sample is to be included using a distribution of the current values. More specifically, a configuration may be employed in which (a) a current value sample having a deviation of the current value which is a predetermined value or greater larger than the distribution of the current values is removed from the samples for calculating the representative value, (b) the representative value itself is not calculated when the deviation of the current value distribution itself is large, etc. The condition of (b) can also be described in other words as calculating the representative value only when the deviation of the current value distribution itself is less than or equal to the predetermined value. By removing the current value samples using at least one of (a) or (b) described above, it is possible to improve the precision of the representative value, and consequently, the precision of calculation of SOC. In the case of the condition of (b), if two threshold voltages Vth1 and Vth2 are employed and one of the distributions of IBm and IBn is large, there would be only one representative value, and thus it is preferable that three or more threshold voltages are employed if the condition of (b) is to be used.

Specifically, the current at the time when the block voltage has reached the threshold voltage Vth can be sequentially stored by supplying outputs from the comparators 140-1 or the like in FIG. 1 to the determining unit 160, capturing the comparator output and the current value from the current sensor 180 at the determining unit 160 into a register, and transferring the current value stored in the register to the memory at the time when the comparator output changes. The comparator output may have, for example, 8 bits, and it is determined whether or not a previous value and the current value match. When the previous value and the current value do not match, it is determined that the comparator output has changed, that is, the block voltage has reached the threshold voltage Vth. In a strict sense, the current value at the time when the comparator output has changed may be any time of immediately before the comparator output changes or immediately after the comparator output changes, or may be an average value of current values at the time immediately before the comparator output changes and the time immediately after the comparator output changes. In any case, it is sufficient that the simultaneity within the allowable range be secured, as described above.

Moreover, in the present embodiment, the current values are sampled at times when two or more threshold voltages are reached. Alternatively, it is also possible to use a single threshold voltage Vth and calculate the SOC based on only the current at the time when the threshold voltage Vth is reached. When the electric storage device is a lithium-ion battery or the like and is equipped as a power supply of a digital electronic device such as a cellular phone, the load of the electric storage device changes in pulses or regularly, and thus the terminal voltage changes in pulses or regularly during loaded drive. Therefore, by setting a suitable threshold value Vth, it is possible to sample the current value at the time when the terminal voltage reaches the threshold value Vth. As already described, Vocv is calculated based on the current values at the time when the terminal voltage reaches the threshold voltage, and because Vocv and SOC are in a certain relationship, the current value at the time when the terminal voltage reaches the threshold voltage and SOC are in a correspondence relationship. Therefore, it is possible to measure, in advance by experimentation or simulation, a correspondence relationship between the current value at the time when the terminal voltage reaches the threshold voltage and the SOC, store the measured correspondence relationship in a memory as a map, and calculate the SOC corresponding to the detected current value by referring to the map. When a single threshold voltage is used, the precision of the current value at the time when the terminal voltage reaches the threshold voltage becomes problematic. However, when the load changes in pulses or regularly, the sampling timing of the current value is also regular to a certain degree. It is therefore possible to efficiently remove noise by calculating a representative current value based on an average value of sampled current values only for cases when, for example, the number of current samples in a unit time is a predetermined value or greater. In addition, because there is a possibility of mixing of noise when the number of current samples in a unit time is too large, it is also preferable to calculate the average value of only the cases when the number of current samples in a unit time is within a predetermined range. Alternatively, it is also possible to use only data having a low variation of current values sampled in a unit time.

Figure 14:
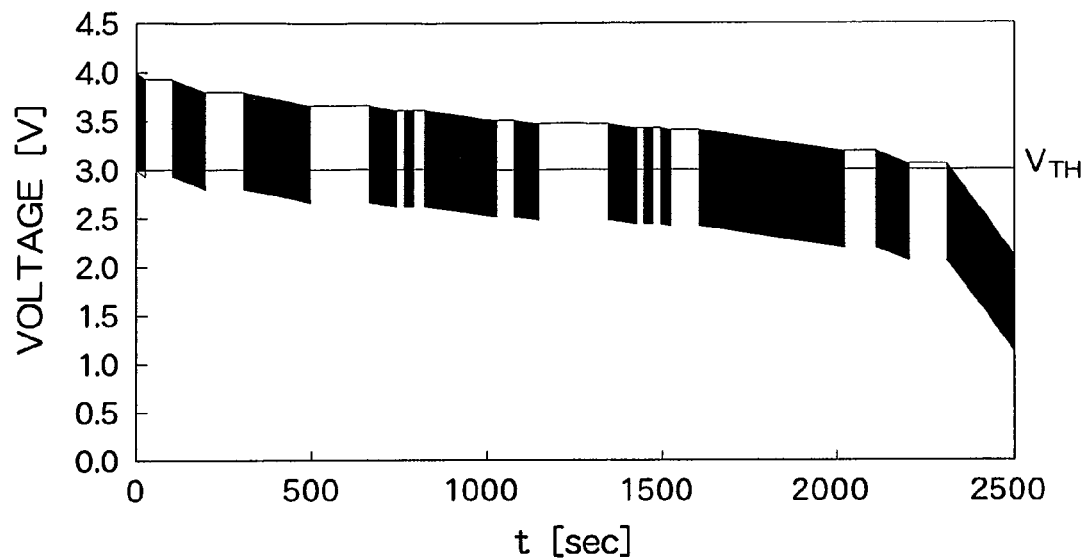
FIG. 14 is a graph showing a change with respect to time of a terminal voltage in another preferred embodiment of the present invention.

FIG. 14 shows a change with respect to time of a terminal voltage when a battery which is an electric storage device (for example, a lithium-ion battery) is equipped in a digital electronic device such as a cellular phone. Because the load is driven in pulses, the discharge current flows in pulses, and the terminal voltage changes in pulses. In FIG. 14, a portion colored in black indicates that a terminal voltage changes in pulses. The threshold voltage Vth is set, for example, at Vth=3.0 V as shown in FIG. 14, and the current at the time when the terminal voltage reaches the threshold voltage Vth is detected. The basic structure is similar to that shown in FIG. 1. The terminal voltage of the battery is detected by a voltage sensor, the detected voltage and the threshold voltage Vth are compared by a comparator, and the comparator outputs a sampling signal to the determining unit 160 at the time of matching between the detected voltage and the threshold voltage Vth. The determining unit 160 samples the battery current at the timing of the sampling signal and sequentially obtains the current value. Then, the average value of only the data having the number of samples in a unit time within a certain range is calculated and set as a representative current value In.

Figure 15:
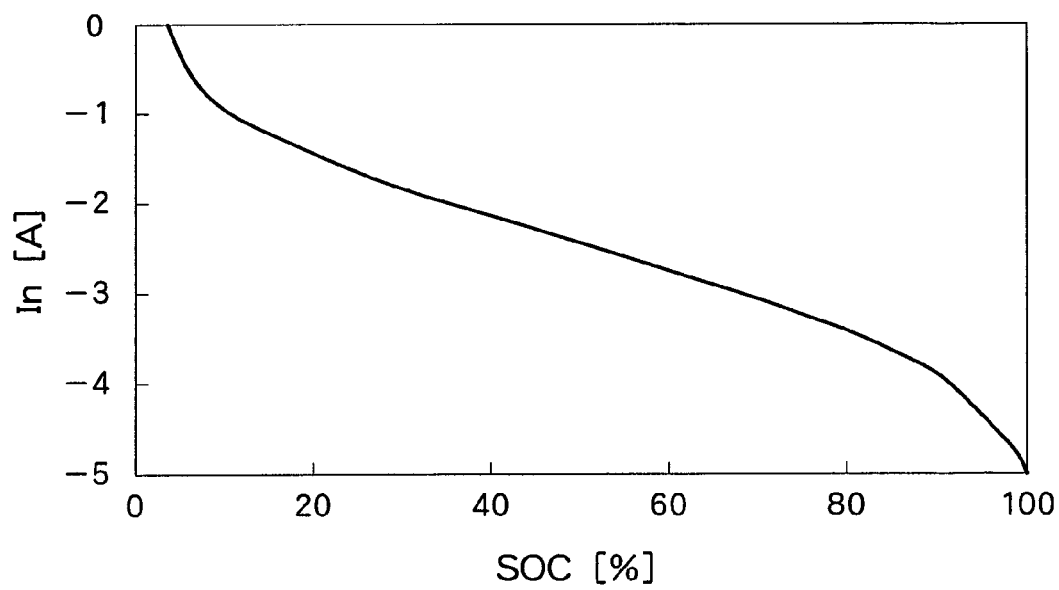

FIG. 15 shows a map which is determined in advance through experimentation or simulation, which is stored in the memory of the determining unit 160, and which defines a correspondence relationship between the SOC and the current value. The vertical axis represents a representative value of a discharge current value in which the terminal voltage becomes equal to the threshold voltage. When the SOC is high, the terminal voltage does not become equal to the threshold voltage at a small discharge current value, and the terminal voltage becomes equal to the threshold value and the current value can be sampled only with a large discharge current. When, on the other hand, the SOC is low, the terminal voltage becomes equal to the threshold voltage with only a small discharge current value, and the current value is detected. Therefore, as shown in FIG. 15, there is a positive correlation between SOC and In. Namely, when the SOC is low, In is also low and, when the SOC is high, In is also high. With the use of the map, the SOC of the battery can be calculated based on detected In.

The invention claimed is:

1. A device which detects a state of charge of an electric storage device, comprising:
    a comparator which, before comparing an electric storage device voltage, is supplied with a first predetermined voltage that has been set at a threshold value that is within a voltage change range when the electric storage device repeats charging and discharging, is supplied with a second predetermined voltage that has been set at a threshold value that is within a voltage change range when the electric storage device repeats charging and discharging, and then compares the electric storage device voltage to the first and the second predetermined voltages;
    a measuring unit which measures a first current value at a specific time when a voltage of the electric storage device becomes equal to the first predetermined voltage and a second current value at a time when the voltage of the electric storage device becomes equal to the second predetermined voltage; and
    a detecting unit which calculates an open end voltage of the electric storage device based on the first current value, the second current value, the first predetermined voltage, and the second predetermined voltage and calculates a state of charge corresponding to the calculated open end voltage based on a correspondence relationship between the open end voltage and the state of charge stored in advance.

2. A detecting device of state of charge of an electric storage device comprising:
    a comparator which, before comparing an electric storage device voltage, is supplied with a first predetermined voltage that has been set at a threshold value that is within a voltage change range when the electric storage device repeats charging and discharging, is supplied with a second predetermined voltage that has been set at a threshold value that is within a voltage change range when the electric storage device repeats charging and discharging, and then compares the electric storage device voltage to the first and the second predetermined voltages;
    a measuring unit which measures a first current value at a time when a voltage of the electric storage device becomes equal to the first predetermined voltage and a second current value at a time when the voltage of the electric storage device becomes equal to the second predetermined voltage; and
    a detecting unit comprising:
    a unit which calculates a first representative current value through a predetermined statistical process based on a plurality of the measured first current values and calculates a second representative current value through a predetermined statistical process based on a plurality of the measured second current values;
    a unit which calculates an open end voltage of the electric storage device based on the calculated first representative current value, the calculated second representative current value, the first predetermined voltage, and the second predetermined voltage;
    a unit which stores, in advance, a correspondence relationship between an open end voltage and a state of charge; and
    a unit which calculates a state of charge corresponding to the calculated open end voltage based on the calculated open end voltage and the correspondence relationship.

3. A method of detecting a state of charge of an electric storage device, comprising the steps of:
    before comparing an electric storage device voltage, setting a first predetermined voltage at a threshold value that is within a voltage change range when the electric storage device repeats charging and discharging, setting a second predetermined voltage at a threshold value that is within a voltage change range when the electric storage device repeats charging and discharging, and then comparing a voltage of the electric storage device to the first and the second predetermined voltages;
    measuring a first current value at a time when a voltage of the electric storage device becomes equal to the first predetermined voltage and a second current value at a time when the voltage of the electric storage device becomes equal to the second predetermined voltage; and
    calculating an open end voltage of the electric storage device based on the first current value, the second current value, the first predetermined voltage, and the second predetermined voltage and calculating a state of charge corresponding to the calculated open end voltage based on a correspondence relationship between the open end voltage and the state of charge stored in advance.

4. The detecting device of state of charge of electric storage device according to claim 1, wherein
    the measuring unit measures a current value having a time lag of within 100 msec as the current values at the times when the voltage of the electric storage device becomes equal to the first predetermined voltage and the second predetermined voltage.

5. The detecting device of state of charge of electric storage device according to claim 2, wherein
    the unit which calculates the first representative current value and the second representative current value extracts, among the plurality of measured first current values and the plurality of measured second current values, only current values within a certain range, and calculates the first representative current value and the second representative current value through the predetermined statistical process.

6. A device which detects a state of charge of an electric storage device, comprising:
    a comparator which, before comparing an electric storage device voltage, is supplied with a first predetermined voltage that has been set at a threshold value that is within a voltage change range when the electric storage device repeats charging and discharging, is supplied with a second predetermined voltage that has been set at a threshold value that is within a voltage change range when the electric storage device repeats charging and discharging, is supplied with a third predetermined voltage that has been set at a threshold value that is within a voltage change range when the electric storage device repeats charging and discharging, and then compares the electric storage device voltage to the first, second, and the third predetermined voltages;

a measuring unit which measures a first current value, a second current value, and a third current value at times when a voltage of the electric storage device becomes equal to the first predetermined voltage, the second predetermined voltage, and the third predetermined voltage, respectively; and a detecting unit which detects the state of charge of the electric storage device based on the measured first current value, the measured second current value, and the measured third current value, wherein the detecting unit comprises:

a unit which calculates a first representative current value through a predetermined statistical process based on a plurality of the measured first current values, calculates a second representative current value through a predetermined statistical process based on a plurality of the measured second current values, and calculates a third representative current value through a predetermined statistical process based on a plurality of the measured third current values;

a unit which calculates an open end voltage of the electric storage device based on the calculated first representative current value, the calculated second representative current value, the calculated third representative current value, the first predetermined voltage, the second predetermined voltage, and the third predetermined voltage;

a unit which stores, in advance, a correspondence relationship between an open end voltage and a state of charge; and a unit which calculates a state of charge corresponding to the calculated open end voltage based on the calculated open end voltage and the correspondence relationship, and the unit which calculates the first representative current value, the second representative current value, and the third representative current value calculates the representative current value based only on a plurality of current values, among the plurality of measured first current values, the plurality of measured second current values, and the plurality of measured third current values, having a degree of distribution of a certain value or less.

7. A device which detects a state of charge of an electric storage device, comprising:

a comparator which, before comparing an electric storage device voltage, is supplied with predetermined voltages that have been set at threshold values that are within a voltage change range when the electric storage device repeats charging and discharging, and then compares the electric storage device voltage to the predetermined voltages;

a measuring unit which measures current values for each of a plurality of blocks at a time when a voltage of each of the blocks becomes equal to the predetermined voltages; and a detecting unit which calculates an open end voltage of the electric storage device based on the current and predetermined voltages, and calculates a state of charge corresponding to the calculated open end voltage based on a correspondence between the open end voltage and the state of charge stored in advance.

8. The detecting device of state of charge of electric storage device according to claim 7, wherein the detecting unit comprises:

a unit which calculates a representative current value through a predetermined statistical process based on a plurality of the measured current values;

a unit which stores, in advance, a correspondence relationship between a representative current value and a state of charge; and a unit which calculates a state of charge corresponding to the calculated representative current value based on the correspondence relationship.

* * * * *